US011532941B2

(12) United States Patent
Thomas et al.

(10) Patent No.: US 11,532,941 B2
(45) Date of Patent: Dec. 20, 2022

(54) BATTERY WITH SWITCHED ACCUMULATORS

(71) Applicant: Commissariat à l'Énergie Atomique et aux Énergies Alternatives, Paris (FR)

(72) Inventors: Rémy Thomas, Echirolles (FR); Sylvain Bacquet, Chasselay (FR); Léandro Cassarino, Talence (FR); Ghislain Despesse, Voreppe (FR); Eric Fernandez, Saint Paul de Varces (FR); Yan Lopez, Renage (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 137 days.

(21) Appl. No.: 16/959,798

(22) PCT Filed: Jan. 3, 2019

(86) PCT No.: PCT/FR2019/050007
§ 371 (c)(1),
(2) Date: Jul. 2, 2020

(87) PCT Pub. No.: WO2019/135051
PCT Pub. Date: Jul. 11, 2019

(65) Prior Publication Data
US 2020/0373765 A1 Nov. 26, 2020

(30) Foreign Application Priority Data

Jan. 5, 2018 (FR) ..................................... 1850067

(51) Int. Cl.
*H02J 7/00* (2006.01)
*G01R 31/396* (2019.01)
*G01R 31/3832* (2019.01)

(52) U.S. Cl.
CPC ........ *H02J 7/0024* (2013.01); *G01R 31/3832* (2019.01); *G01R 31/396* (2019.01);
(Continued)

(58) Field of Classification Search
USPC .................................................. 320/134, 118
See application file for complete search history.

(56) References Cited

U.S. PATENT DOCUMENTS

2013/0335034 A1* 12/2013 Suzuki ............. H01M 10/0525
320/160
2014/0347060 A1 11/2014 Carkner et al.
(Continued)

FOREIGN PATENT DOCUMENTS

FR 2 976 365 A1 12/2012

OTHER PUBLICATIONS

International Preliminary Report on Patentability for International Application No. PCT/FR2019/050007, dated Jul. 16, 2020.
(Continued)

*Primary Examiner* — Samuel Berhanu
(74) *Attorney, Agent, or Firm* — Wolf, Greenfield & Sacks, P.C.

(57) ABSTRACT

A method of controlling a battery including a first control circuit and a plurality of modules arranged between first and second terminals. Each module comprises electric cells. The battery further includes a sensor of the current flowing through the first terminal. The method includes the successive steps of: updating a first counter representative of the quantity of charges flowing through the first terminal; for each electric cell, for each connection of the electric cell to the other electric cells, storing into first data the value of the first counter on connection of the electric cell and for each disconnection of the electric cell from the other electric cells, storing a second counter equal to the difference
(Continued)

between the value of the first counter on disconnection of the electric cell and the first data of said electric cell.

10 Claims, 3 Drawing Sheets

(52) U.S. Cl.
CPC ........ *H02J 7/00036* (2020.01); *H02J 7/0048* (2020.01); *H02J 7/00712* (2020.01)

(56) References Cited

U.S. PATENT DOCUMENTS

| 2014/0365792 | A1* | 12/2014 | Yun | H02J 7/00047 |
| | | | | 713/320 |
| 2016/0126756 | A1* | 5/2016 | Okubo | H02J 7/007 |
| | | | | 320/134 |
| 2016/0141894 | A1* | 5/2016 | Beaston | H02J 7/0014 |
| | | | | 320/103 |
| 2017/0047747 | A1 | 2/2017 | Kufner | |

OTHER PUBLICATIONS

International Search Report and Written Opinion for International Application No. PCT/FR2019/050007, dated Mar. 11, 2019.

\* cited by examiner

US 11,532,941 B2

BATTERY WITH SWITCHED ACCUMULATORS

This application is a national stage filing under 35 U.S.C. § 371 of International Patent Application Serial No. PCT/FR2019/050007, filed Jan. 3, 2019, which claims priority to French patent application FR18/50067, filed Jan. 5, 2018. The contents of these applications are incorporated herein by reference in their entireties.

BACKGROUND

The present disclosure relates to the field of batteries with switched electric cells.

DISCUSSION OF THE RELATED ART

A battery comprises a plurality of electric cells. The battery operation may require estimating the state of charge of each cell of the battery. The estimation of the state of charge of a cell is generally obtained from the measurement of the voltage across the cell. For certain types of cells, for example, lithium iron phosphate cells called LFP or LiFe, which are lithium-ion electric cells having their cathode made of lithium iron phosphate ($LiFePO_4$), the curve of the variation of the voltage across the cell according to the state of charge of the cell comprises an area of low slope so that the voltage measurement alone cannot enable to estimate the state of charge with a sufficient accuracy. It may then be necessary to further measure the current flowing through the cell to increase the accuracy of the estimation of the state of charge. The estimation of the state of charge of the cell is then obtained from the count of the electric cells entering the cell and coming out of the cell.

For a battery where the cells are statically connected to one another, a single sensor of measurement of the intensity of the current flowing between the battery terminals may be used to know the current flowing through each cell.

A switched cell battery is a battery comprising a plurality of generally identical modules connected in series and/or in parallel. Each module comprises a plurality of electric cells or accumulators. Switches connected in series and in parallel with the cells enable to couple or not in series and/or in parallel each cell between the output nodes of the module, to select the output voltage among the different combinations of the voltages supplied by the cells.

To determine the current flowing through each cell of a switched cell battery, a possibility is to use a current sensor for each cell. However, this causes an increase in the battery manufacturing cost.

SUMMARY

Thus, an object of an embodiment is to at least partly overcome the disadvantages of methods of estimation of the state of charge of the cells of the previously-described switched-cell batteries.

An object of an embodiment is for the number of current sensors of the battery to be smaller than the number of battery cells.

An object of an embodiment is for the estimation of the state of charge of each cell of the battery to be performed with an improved accuracy.

Thus, an embodiment provides a method of controlling a battery comprising a first control circuit and a plurality of modules arranged between first and second terminals, each module comprising third and fourth terminals, at least one of the third and fourth terminals of each module being coupled to one of the third and fourth terminals of another module, each module comprising electric cells and switches coupling the cells to one another and to the third and fourth terminals of the module and a second switch control circuit, the battery further comprising at least one data transmission bus coupling the first control circuit to each second control circuit and a sensor of the current flowing through the first terminal, the method comprising the successive steps of:

updating a first counter representative of the quantity of charges flowing through the first terminal based on the sensor measurements;

for each electric cell, for each connection of the electric cell to the other electric cells, storing in first data the value of the first counter on connection of the electric cell and for each disconnection of the electric cell from the other electric cells, storing a second counter equal to the difference between the value of the first counter on disconnection of the electric cell and the first data of said electric cell.

According to an embodiment, the method further comprises, for at least one of the connected electric cells and at at least one time, successively the storage into the second counter of the difference between the value of the counter at said time and the first data of said electric call and the storage into the first data of the value of the first counter at said time.

According to an embodiment, the first counter is updated when the battery is in charge mode.

According to an embodiment, the method further comprises the successive steps of:

updating a third counter representative of the quantity of charges flowing through the first terminal based on the sensor measurements when the battery is in discharge mode;

for each electric cell, for each connection of the electric cell to the other electric cells, storing into second data the value of the third counter on connection of the electric cell and for each disconnection of the electric cell from the other electric cells, storing into a fourth counter the difference between the value of the third counter on disconnection of the electric cell and the second data of said electric cell.

According to an embodiment, the method further comprises, for at least one of the connected electric cells and at at least one time, successively the storage into the fourth counter of the difference between the value of the second counter at said time and the second data of said electric cell and the storage into the second data of the value of the third counter at said time.

According to an embodiment, the method further comprises the reception by the first control circuit of a new set point for the delivery of a voltage, of a current, and/or of a number of electric cells to be connected between the first and second terminals.

According to an embodiment, the method comprises the transmission, by the first control circuit to the second control circuits, of control signals for the connection or the disconnection of at least one of the electric cells of the modules to follow said set point.

According to an embodiment, the method comprises the transmission, by the first control circuit to the second control circuits, of a control signal representative of a number of electric cells to be connected and the determination by at least one of the second control circuits of control signals for the connection or the disconnection of at least one of the electric cells of the module containing said second control circuit.

An embodiment also provides a battery comprising a first control circuit and a plurality of modules arranged between first and second terminals, each module comprising third and fourth terminals, at least one of the third and fourth terminals of each module being coupled to one of the third and fourth terminals of another module, each module comprising electric cells and switches coupling the cells to one another and to the third and fourth terminals of the module and a second switch control circuit, the battery further comprising at least one data transmission bus coupling the first control circuit to each second control circuit and a sensor of the current flowing through the first terminal, the first control circuit being capable of updating a first counter representative of the quantity of charges flowing through the first terminal based on the measurement of the sensor and, for each electric cell, for each connection of the electric cell to the other electric cells, the first control circuit or the second control circuit associated with said electric cell being capable of storing into first data the value of the first counter on connection of the electric cell and for each disconnection of the electric cell from the other electric cells, being capable of storing into a second counter the difference between the value of the first counter on disconnection of the electric cell and the first data of said electric cell.

According to an embodiment, the battery comprises a single sensor of the current flowing through the electric cells.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. For the sake of clarity, only the elements that are useful for an understanding of the embodiments described herein have been illustrated and described in detail. In particular, the conventional functions carried out by the master and slave control circuits of a cell battery, such as the cell balancing, are well known by those skilled in the art and are not described in further detail hereafter. In the following description, the expressions "substantially", "about", "approximately", and "in the order of" mean "within 10%", preferably within 5%.

Figure 1:
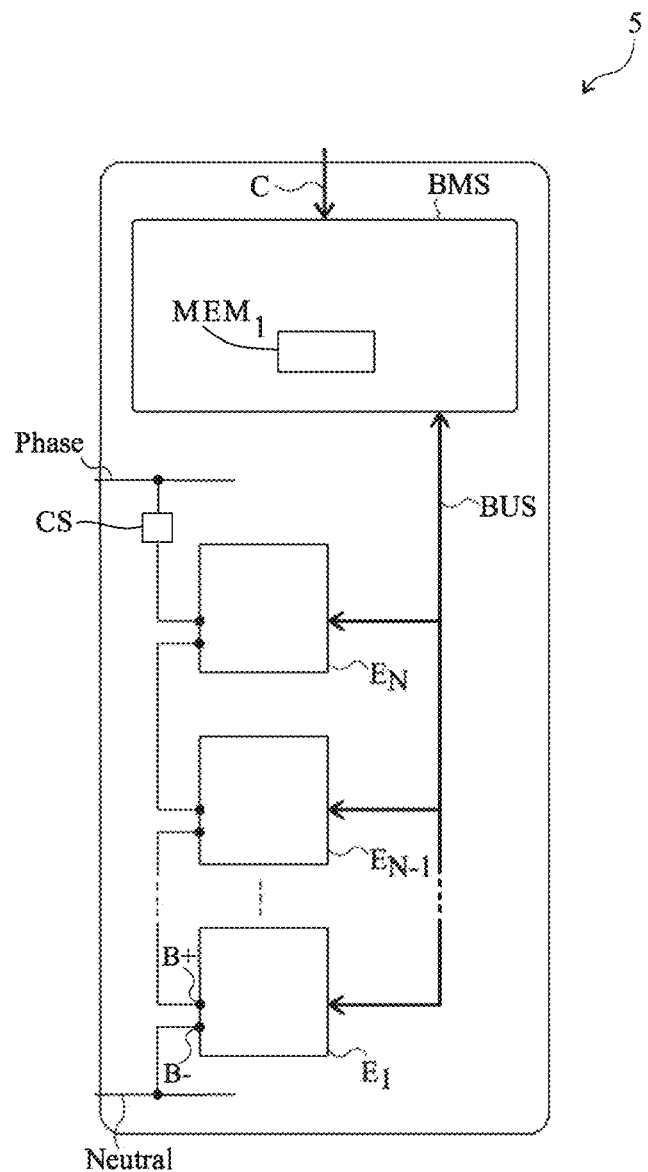
FIGS. 1 and 2 partially and schematically show embodiments of a cell battery.

FIG. 1 shows an embodiment of a switched cell battery 5. Battery 5 comprises N modules $E_1$ to $E_N$. Number N is an integer that may be in the range from 1 to 50. Each module comprises a positive terminal B+ and a negative terminal B− and a plurality of electric accumulators, not shown, also called cells, capable of being connected to one another in series and/or in parallel via switches, not shown, between terminals B+ and B−. Modules $E_1$ to $E_N$ may be series-connected between a first terminal Neutral of battery 5 and a second terminal Phase of battery 5.

Battery 5 comprises a circuit BMS for controlling modules $E_1$ to $E_N$, called master control circuit hereafter. Master control circuit BMS may exchange data with each module $E_1$ to $E_N$ via a bidirectional data transmission BUS. Each module $E_1$ to $E_N$ comprises a circuit, not shown, for controlling switches of the module, called slave control circuit hereafter, based on the control signals supplied by master control circuit BMS. Each module $E_1$ to $E_N$ further comprises sensors, not shown, for example, sensors of the voltage across each cell of the module, and/or sensors of the temperature of each cell of the module. The slave control circuit of each module $E_1$ to $E_N$ is capable of transmitting to master control circuit BMS data representative of the voltage and/or temperature measurements over data transmission bus BUS. The battery further comprises a sensor CS of the intensity of the current flowing through terminal Phase and is coupled to master control circuit BMS. Preferably, battery 5 comprises no other current intensity sensor.

Master control circuit BMS may correspond to a dedicated circuit and/or may comprise a processor, for example, a microprocessor or a microcontroller, capable of executing instructions of a computer program stored in the memory MEM1. Master control circuit BMS may receive a set point C, for example, a voltage set point, a current set point, or a set point for the number of cells to be connected, and may transmit data to the modules via data transmission bus BUS from which, for each module, the slave control circuit of the module connects or disconnects the cells of the module to obtain the voltage, the current, and/or the number of connected cells between terminals Phase and Neutral of battery 5.

Figure 2:
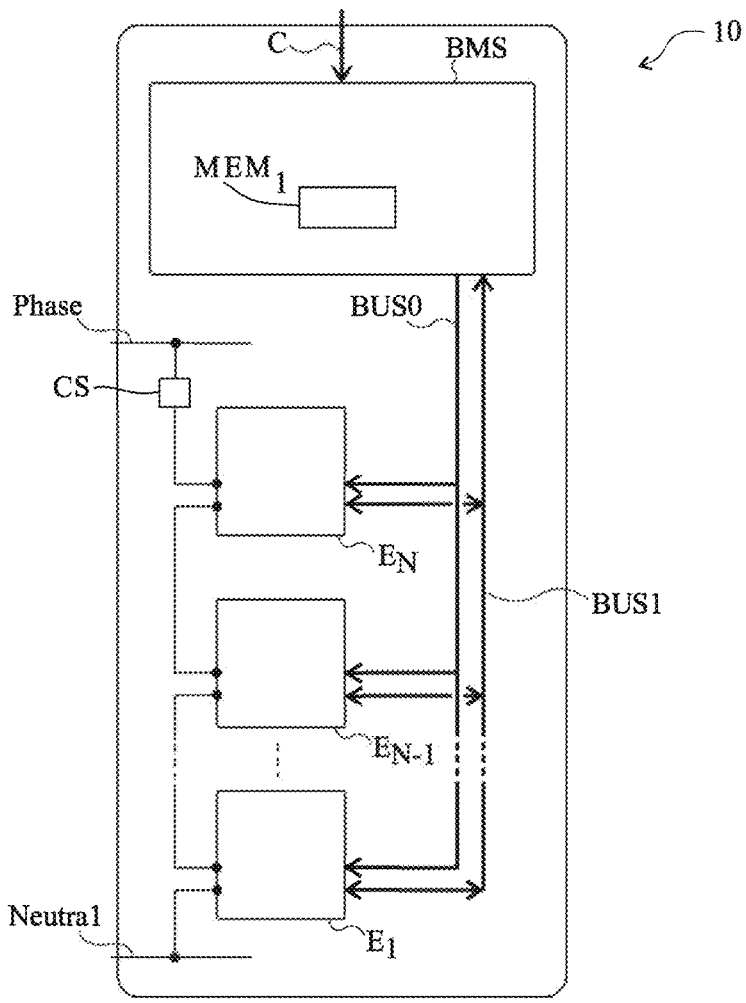

FIG. 2 shows another embodiment of a battery 10. Battery 10 comprises all the elements of battery 5 shown in FIG. 1, with the difference that bus BUS is replaced with two buses BUS0 and BUS1, which each couple master control circuit BMS to each module $E_1$ to $E_N$.

Bus BUS0 is a fast bus, that is, a bus over which the data are transmitted at a rate greater than 3 megabits per second, preferably in the range from 5 megabits per second to 7 megabits per second. Bus BUS0 may be a unidirectional bus. As an example, bus BUS0 is a bus according to the RS485 standard. Bus BUS1 is a slow bus, that is, a bus over which the data are transmitted at a rate smaller than 3 megabits per second, preferably in the range from 0.5 megabit per second to 1 megabit per second. Bus BUS1 is a bidirectional bus. As an example, bus BUS1 is a CAN data bus, particularly according to ISO standard 11898. Fast bus BUS0 may be used for the transmission of first data supplied by master control circuit BMS to the slave control circuits to follow set point C. Slow bus BUS1 may be used for the exchange of all the other data between master control circuit BMS and each module $E_1$ to $E_N$.

Figure 3:
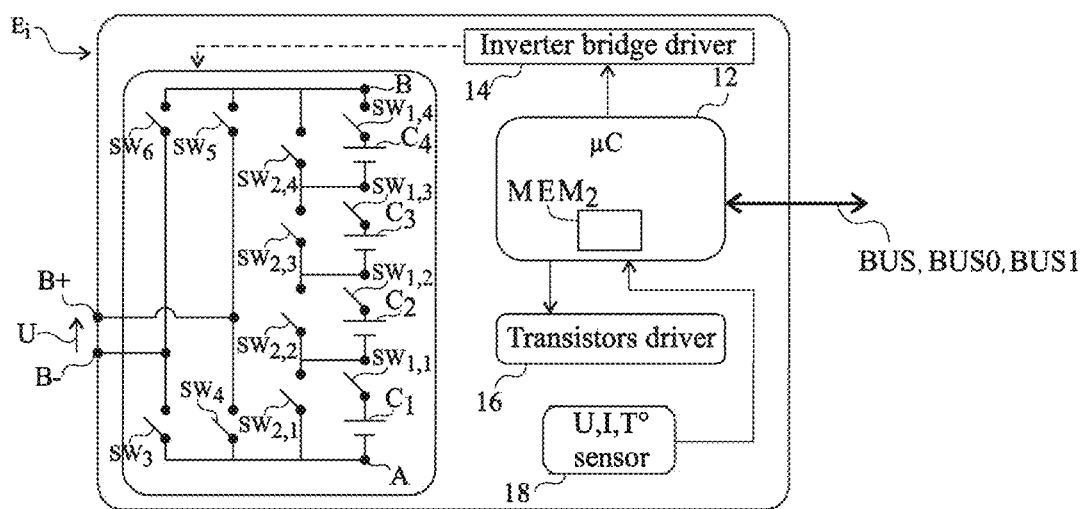
FIG. 3 partially and schematically shows an example of a module of the battery of FIG. 1 or 2.

FIG. 3 shows an embodiment of module $E_i$, where i varies from 1 to N, each module $E_1$ to $E_N$ may have a similar structure.

According to the present embodiment, module $E_i$ is capable of delivering a voltage $U_i$ between positive terminal B+ and negative terminal B−. Module $E_i$ comprises cells $C_1$ to $C_M$, where M is an integer in the range from 2 to 10, preferably from 2 to 5, four cells $C_1$, $C_2$, $C_3$, and $C_4$ being shown as an example in FIG. 3. Cells $C_1$ to $C_M$ are coupled together and to terminals B+ and B− by switches. In the present embodiment, for each cell $C_k$, k being an integer varying from 1 to M, module $E_i$ comprises a first switch $SW_{1,k}$ in series with cell $C_k$ and a second switch $SW_{2,k}$ in parallel with the assembly comprising cell $C_k$ and switch $SW_{1,k}$. The M assemblies comprising cell $C_k$ and first switch $SW_{1,k}$ are arranged in series between a node A and a node B. The control of switches $SW_{1,k}$ and $SW_{2,k}$, with k varying from 1 to M, enables to place in series between nodes A and B from 1 to M cells among the M cells $C_1$ to $C_M$. In the present embodiment, module $E_i$ further comprises an inverter bridge, also called H bridge, between nodes A and B and terminals B+ and B−, which enables to apply the voltage present between nodes A and B between terminals B+ and B− in both directions. According to an embodiment, the inverter bridge comprises a switch $SW_3$ coupling node A to terminal B+, a switch $SW_4$ coupling node A to terminal B−, a switch $SW_5$ coupling node B to terminal B+, and a switch $SW_6$ coupling node B to terminal B−. As an example, each switch $SW_{1,k}$ and $SW_{2,k}$, with k varying from 1 to M, $SW_3$, $SW_4$, $SW_5$, and $SW_6$ may correspond to an insulated-gate field effect transistor, also called MOS transistor, particularly a MOS power transistor, for example, an N-channel MOS transistor.

Each module $E_i$ further comprises slave control circuit 12 (µC) capable of exchanging and/or of receiving data transmitted by master control circuit BMS over bus BUS for battery 5 or over buses BUS0 and BUS1 for battery 10. Slave control circuit 12 may correspond to a dedicated circuit and/or may comprise a processor, for example, a microprocessor or a microcontroller, capable of executing instructions of a computer program stored in a memory MEM2.

Each module $E_i$ further comprises a driver circuit 14 (Inverter bridge driver) coupled to switches $SW_3$, $SW_4$, $SW_5$, and $SW_6$ of the inverter bridge and a driver circuit 16 (Transistors driver) coupled to switches $SW_{1,k}$ and $SW_{2,k}$, with k varying from 1 to M. Each driver circuit 14, 16 is capable of converting the control signals delivered by slave control circuit 12 into signals capable of controlling the switches of module $E_i$.

Each module $E_i$ further comprises sensors 18 (U, I, T° sensor) coupled to slave control circuit 12. Module $E_i$ may comprise, for each cell $C_k$, a temperature sensor capable of measuring the temperature of cell $C_k$. Module $E_i$ may further comprise, for each cell $C_k$, a voltage sensor capable of measuring the voltage across cell $C_k$. The slave control circuit 12 of each module $E_i$ is capable of transmitting data to master control circuit BMS over bus BUS for battery 5 or over slow bus BUS1 for battery 10, representative of the measurements performed by the sensors 18 of module $E_i$. The number and type of sensors particularly depend on the arrangement of the cells of module $E_i$.

In the embodiment illustrated in FIG. 3, an activation of a cell $C_k$ of a module $E_i$ means that cell $C_k$ is placed in series between nodes A and B of module $E_i$, which is obtained by turning on switch $SW_{1,k}$ and by turning off switch $SW_{2,k}$, and a deactivation of a cell $C_k$ of a module $E_i$ means that the series connection of cell $C_k$ between nodes A and B of module $E_i$ is interrupted, which is obtained by turning off switch $SW_{1,k}$ and by turning on switch $SW_{2,k}$.

The orders to activate and to deactivate the cell may be performed according to different embodiments. According to an embodiment, master control circuit BMS transmits an activation/deactivation control signal specific to the slave control circuit 12 of a module $E_i$ containing a cell $C_k$ to be activated or deactivated. An advantage of such an embodiment is that only the slave control circuits of the modules containing cells to be activated or to be deactivated are used. The structure of each slave control circuit may be simple. Further, different slave control circuits may be used closely in time. According to another embodiment, master control circuit BMS transmits to each slave control circuit 12 a voltage or current set point to be supplied by the battery or a set point for the total number of cells to be connected. The slave control circuit 12 of each module $E_i$ then determines which cells of the module should be activated/deactivated to follow the set point. Such an embodiment has the advantage of allowing large voltage variation amplitudes for each new set point.

Figure 4:
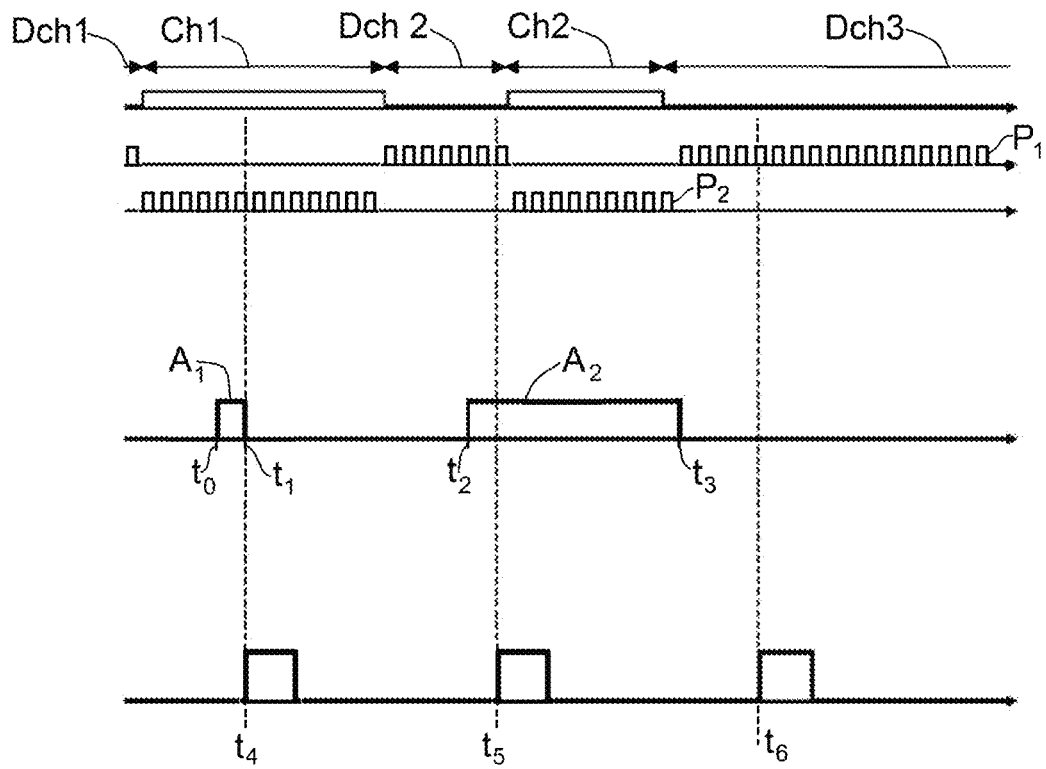
FIG. 4 is a timing diagram illustrating another embodiment of a method of determining the states of charge of the cells of a battery.

FIG. 4 is a timing diagram illustrating an embodiment of a method of determining the state of charge of each cell $C_k$ of battery 5 or 10. FIG. 4 shows phases of operation of battery 5 or 10 successively comprising a discharge phase Dch1, a charge phase Ch1, a discharge phase Dch2, a charge phase Ch2, and a discharge phase Dch3.

According to an embodiment, master control circuit BMS uses two general counters Cptr_AhCh and Cptr_AhDch. The first general counter Cptr_AhCh is representative of the total number of charges flowing through the battery when the battery is in charge mode. The second general counter Cptr_AhDch is representative of the total number of charges flowing through the battery when the battery is in discharge mode. Each general counter Cptr_AhCh, Cptr_AhDch is determined based on the intensity of the current measured by sensor CS. According to an embodiment, each general counter Cptr_AhCh, Cptr_AhDch is regularly refreshed, for example, periodically, for example, every 50 µs, by master control circuit BMS and is stored in memory MEM1. As an example, when the battery is in charge mode, general counter Cptr_AhDch remains unchanged and general counter Cptr_AhCh is increased at each refreshment of a value representative of the product of the intensity of the current measured by sensor CS and of the duration elapsed since the last refreshment. As an example, when the battery is in discharge mode, general counter Cptr_AhCh remains unchanged and general counter Cptr_AhDch is increased at each refreshment of a value representative of the product of the intensity of the current measured by sensor CS and of the duration elapsed since the last refreshment. FIG. 4 schematically shows by pulses P1 the refreshment of general counter Cptr_AhDch and by pulses P2 the refreshment of general counter Cptr_AhCh.

According to an embodiment, for each cell $C_k$, two local counters $AhCh_k$ and $AhDch_k$ are used. The first local counter $AhCh_k$ is representative of an estimate of the total number of electric charges having circulated in cell $C_k$ when cell $C_k$ is in charge mode. The second local counter $AhDch_k$ is representative of an estimate of the total number of electric charges having circulated in cell $C_k$ when cell $C_k$ is in discharge mode. For each cell $C_k$, local counters $AhCh_k$ and $AhDch_k$ may be stored in memory MEM1 of master control circuit BMS or in memory MEM2 of the slave control circuit 12 of the module $E_i$ containing cell $C_k$.

According to an embodiment, for each cell $C_k$, local counter $AhCh_k$ is updated from general counter Cptr_AhCh and local counter $AhDch_k$ is updated from general counter Cptr_AhDch. According to an embodiment, the method comprises two different operations of update of local counters $AhCh_k$ and $AhDch_k$ for each cell $C_k$.

According to the first update operation, local counters $AhCh_k$ and $AhDch_k$ of cell $C_k$ are updated each time cell $C_k$ is deactivated. More particularly, for each cell, $C_k$, data $SnapAhCh_k$ and $SnapAhDch_k$ are used. Data $SnapAhCh_k$ and $SnapAhDch_k$ may be stored in memory MEM1 of master control circuit BMS or in memory MEM2 of the slave control circuit 12 of the module $E_i$ containing cell $C_k$. When cell $C_k$ is activated, the current value of counter Cptr_AhCh is stored in data $SnapAhCh_k$ and the current value of counter Cptr_AhDch is stored in data $SnapAhDch_k$ independently from the fact that cell $C_k$ is in charge or in discharge mode. When cell $C_k$ is deactivated, independently from the fact that cell $C_k$ is in charge or in discharge mode, counter $AhCh_k$ is updated, that is, the difference between the current value of counter Cptr_AhCh at the time when cell $C_k$ is deactivated and data $SnapAhCh_k$ is stored in counter $AhCh_k$ and counter $AhDch_k$ is updated, that is, the difference between the current value of counter Cptr_AhDch at the time when cell $C_k$ is deactivated and data $SnapAhDch_k$ is stored in data $AhDch_k$.

FIG. 4 shows, for a cell $C_k$, two phases A1 and A2 during which cell $C_k$ is activated. Phase A1 starts with the activation of cell $C_k$ at time t0 and ends with the deactivation of cell $C_k$ at time t1. Phase A2 starts with the activation of cell $C_k$ at time t2 and ends with the deactivation of cell $C_k$ at time t3. As shown in FIG. 4, the battery is in charge mode all along phase A1 while phase A2 starts while the battery is in discharge mode and stops while the battery is in charge mode.

At time t0, the value of counter Cptr_AhCh at time t0 is stored in data $SnapAhCh_k$ and the value of counter Cptr_AhDch at time t0 is stored in data $SnapAhDch_k$. At time t1, the difference between the current value of counter Cptr_AhCh at time t1 and data $SnapAhCh_k$ is stored in counter $AhCh_k$ and the difference between the current value of counter Cptr_AhDch at time t1 and data $SnapAhDch_k$ is stored in counter $AhDch_k$. At time t2, the value of counter Cptr_AhCh at time t2 is stored in data $SnapAhCh_k$ and the value of counter Cptr_AhDch at time t2 is stored in data $SnapAhDch_k$. At time t3, the difference between the current value of counter Cptr_AhCh at time t3 and data $SnapAhCh_k$ is stored in counter $AhCh_k$ and the difference between the current value of counter Cptr_AhDch at time t3 and data $SnapAhDch_k$ is stored in counter $AhDch_k$.

According to the second update operation, local counters $AhCh_k$ and $AhDch_k$ of cell $C_k$ are periodically updated all along the time when cell $C_k$ is being used. This enables to provide a regular update of local counters $AhCh_k$ and $AhDch_k$ of cell $C_k$ even if cell $C_k$ remains activated for a long time while, with the first update operation, local counters $AhCh_k$ and $AhDch_k$ are only updated on deactivation of cell $C_k$. According to an embodiment, the second update operation comprises:

updating counter $AhCh_k$, that is, the difference between the current value of counter Cptr_AhCh and data $SnapAhCh_k$ is stored in counter $AhCh_k$;

updating counter $AhDch_k$, that is, the difference between the current value of counter Cptr_AhDch and data $SnapAhDch_k$ is stored in counter $AhDch_k$;

storing in data $SnapAhCh_k$ the current value of counter Cptr_AhCh; and storing in data $SnapAhDch_k$ the current value of counter Cptr_AhDch.

In FIG. 4, for a cell $C_m$ which is activated, the second update operation is carried out at times t4, t5, and t6.

According to another embodiment, a single general electric charge counter Cptr_Ah is used, be the battery in charge or in discharge mode. General counter Cptr_Ah is then incremented during a battery charge operation and is decremented during a battery discharge operation based on the current intensity measurement supplied by sensor CS. Further, for each cell $C_k$, a single local counter $Ah_k$ and a single piece of data $SnapAh_k$ are used.

According to the first update operation, local counter $Ah_k$ of cell $C_k$ is updated each time cell $C_k$ is deactivated. More particularly, when cell $C_k$ is activated, the current value of counter Cptr_Ah is stored in data $SnapAh_k$. When cell $C_k$ is deactivated, counter $Ah_k$ is updated, that is, the difference between the current value of counter Cptr_Ah and data $SnapAh_k$ is stored in counter $Ah_k$.

According to the second update operation, regularly, for example, periodically, when cell $C_k$ is activated, counter $Ah_k$ is updated, that is, the difference between the current value of counter Cptr_Ah and data $SnapAh_k$ is stored in counter $Ah_k$, and the current value of counter Cptr_Ah is stored in data $SnapAh_k$.

Master control circuit BMS may determine the state of charge of cell $C_k$ based on data $Ah_k$. Master control circuit BMS may implement a cell balancing method based on the determination of the state of charge of the cells.

Figure 5:
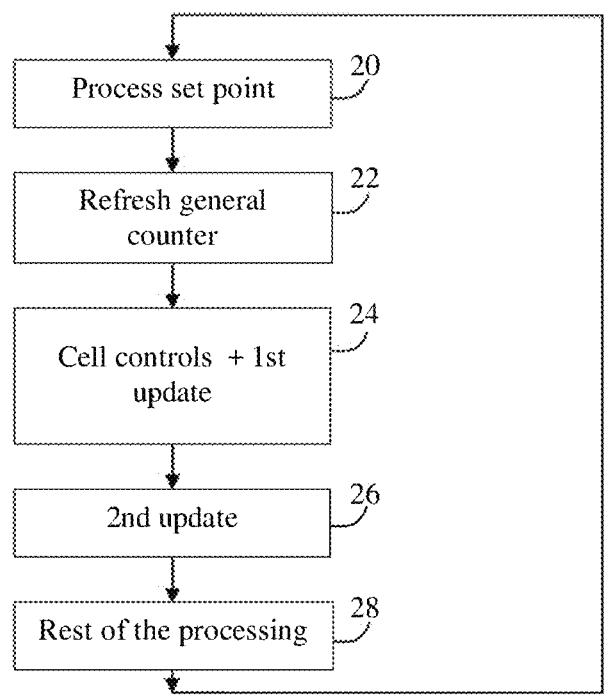
FIG. 5 is a block diagram of an embodiment of a cycle of control of the battery of FIG. 1 or 2.

FIG. 5 is a block diagram of an embodiment of a cycle of control of the battery of FIG. 1 or 2.

At step 20, master control circuit determines the data to be transmitted to modules $E_1$ to $E_N$ based on set point C. The method carries on at step 22.

At step 22, master control circuit BMS updates general counters Cptr_AhCh and Cptr_AhDch or general counter Cptr_AhCh. The method carries on at step 24.

At step 24, master control circuit BMS transmits data to the slave control circuits 12 of modules $E_1$ to $E_N$ capable of causing the activation of at least one cell which was deactivated and/or the deactivation of at least one cell which was activated. The first operation of update of the local counters is carried out for each cell which is activated and for each cell which is deactivated. The method carries on at step 26.

At step 26, the second update operation is carried out. According to an embodiment, the second update operation is implemented for a determined number of cells which are activated, for example, for a single cell which is activated. The duration of step 26 is then advantageously limited. According to an embodiment, a list of cells which are activated is kept in memory MEM1 and, at each cycle, the second update operation is performed for a different activated cell in the list of activated cells. The method carries on at step 28.

At step 28, the rest of the control cycle is implemented.

The embodiments previously described in relation with FIG. 5 advantageously enable the second update operation implemented at step 26 not to interfere with the other operations carried out by master control circuit BMS or slave control circuits 12.

According to an embodiment, at step 24, the first operation of update of a cell which is activated or deactivated may be mainly carried out by master control circuit BMS. In this case, the data $SnapAhCh_k$ and $SnapAhDch_i$ or the data $SnapAh_i$ of each cell $C_i$ are stored in memory MEM1 of master control circuit BMS. For each cell $C_k$ to be activated, master control circuit BMS updates data $SnapAhCh_k$ and $SnapAhDch_k$ or data $SnapAh_k$ of cell $C_k$ based on the current values of the general counters Cptr_AhDch and Cptr_AhCh or on the current value of the general counter Cptr_Ah associated with the slave control circuit 12 of the module $E_j$ containing cell $C_k$ and, for each cell $C_m$ to be deactivated, master control circuit BMS updates local counters $AhCh_m$ and $AhDch_m$ or the general counter $Ah_m$ of cell $C_m$ based on the current values of the general counters Cptr_AhDch and Cptr_AhCh or on the current value of the general counter Cptr_Ah associated with the slave control circuit 12 of the module $E_j$ containing cell $C_k$.

According to another embodiment, at step 24, the first operation of update of a cell which is activated or deactivated may be at least partly carried out by the slave control circuit 12 of the module containing the cell. In this case, master control circuit BMS transmits to each slave control circuit 12 the current values of general counters Cptr_AhDch and Cptr_AhCh or the current value of general counter Cptr_Ah and the slave control circuit 12 of the module $E_i$ containing the cell $C_k$ to be activated initiates the update of data $SnapAhCh_k$ and $SnapAhDch_k$ or of data $SnapAh_k$ of cell $C_k$ and the update of the local counters $AhCh_m$ and $AhDch_m$ or of the general counter $Ah_m$ of the cell $C_m$ to be deactivated. This advantageously enables to decrease the calculations to be performed by master control circuit BMS.

Specific embodiments have been described. Various alterations and modifications will occur to those skilled in the art. In particular, the transistors forming the switches in cells may be replaced with other types of switches according to the needs of the circuit. Further, although in the previously-described examples, the cells are series-connected when they are activated, the cells may generally be connected in series and/or in parallel. In this case, the value of general counters Cptr_AhDch and Cptr_AhCh or of general counter Cptr_Ah used for the update of the local counters $AhDch_k$ and $AhCh_k$ or of the local counter $Ah_k$ and of the data $SnapAhCh_k$ and $SnapAhDch_k$ or of the data $SnapAh_k$ of cell $C_k$ are weighted according to the number of cells activated in parallel.

Various embodiments with different variations have been described hereabove. It should be noted that those skilled in the art may combine various elements of these various embodiments and variations without showing any inventive step.

The invention claimed is:

1. A method of controlling a battery comprising a first control circuit and a plurality of modules arranged between first and second terminals, each module comprising third and fourth terminals, at least one of the third and fourth terminals of each module being coupled to one of the third and fourth terminals of another module, each module comprising electric cells and switches coupling the cells to one another and to the third and fourth terminals of the module and a second switch control circuit, the battery further comprising at least one data transmission bus coupling the first control circuit to each second control circuit and a sensor of the current flowing through the first terminal, the method comprising the successive steps of:

updating a first counter representative of the quantity of charges flowing through the first terminal based on the sensor measurements;

for each electric cell, for each connection of the electric cell to the other electric cells, storing into first data the value of the first counter on connection of the electric cell and for each disconnection of the electric cell from the other electric cells, storing a second counter equal to the difference between the value of the first counter on disconnection of the electric cell and the first data of said electric cell.

2. The method according to claim 1, further comprising, for at least one of the connected electric cells and at least one time, successively the storage into the second counter of the difference between the value of the first counter at said time and the first data of said electric cell and the storage into the first data of the value of the first counter at said time.

3. The method according to claim 1, wherein the first counter is updated when the battery is in charge mode.

4. The method according to claim 3, further comprising the successive steps of:

updating a third counter representative of the quantity of charges flowing through the first terminal based on the sensor measurements when the battery is in discharge mode;

for each electric cell, for each connection of the electric cell to the other electric cells, storing into second data the value of the third counter on connection of the electric cell and for each disconnection of the electric cell from the other electric cells, storing into a fourth counter the difference between the value of the third counter on disconnection of the electric cell and the second data of said electric cell.

5. The method according to claim 4, further comprising, for at least one of the connected electric cells and at least one time, successively the storage into the fourth counter of the difference between the value of the second counter at said time and the second data of said electric cell and the storage into the second data of the value of the third counter at said time.

6. The method according to claim 1, further comprising the reception by the first control circuit of a new set point for the delivery of a voltage, of a current, and/or of a number of electric cells to be connected between the first and second terminals.

7. The method according to claim 6, comprising the transmission, by the first control circuit to the second control circuits, of control signals for the connection or the disconnection of at least one of the electric cells of the modules to follow said set point.

8. The method according to claim 6, comprising the transmission, by the first control circuit to the second control circuits, of a control signal representative of a number of electric cells to be connected and the determination by at least one of the second control circuits of control signals for the connection or the disconnection of at least one of the electric cells of the module containing said second control circuit.

9. A battery comprising a first control circuit and a plurality of modules arranged between first and second terminals, each module comprising third and fourth terminals, at least one of the third and fourth terminals of each module being coupled to one of the third and fourth terminals of another module, each module comprising electric cells and switches coupling the cells to one another and to the third and fourth terminals of the module and a second switch control circuit, the battery further comprising at least one data transmission bus coupling the first control circuit to each second control circuit and a sensor of the current flowing through the first terminal, the first control circuit being capable of updating a first counter representative of the quantity of charges flowing through the first terminal based on the sensor measurements and, for each electric cell, for each connection of the electric cell to the other electric cells, the first control circuit or the second control circuit associated with said electric cell being capable of storing into first data the value of the first counter on connection of the electric cell, and, for each disconnection of the electric cell from the other electric cells, being capable of storing into a second counter the difference between the value of the first counter on disconnection of the electric cell and the first data of said electric cell.

10. The battery according to claim 9, comprising a single sensor of the current flowing through the electric cells.

* * * * *